(12) United States Patent
Narushima et al.

(10) Patent No.: US 6,426,138 B1
(45) Date of Patent: Jul. 30, 2002

(54) ADHESIVE FILM FOR ELECTRONIC PARTS

(75) Inventors: Hitoshi Narushima; Toshihiro Nakajima, both of Shizuoka (JP)

(73) Assignee: Tomoegawa Paper Co., Ltd., Tokyo (JP)

( * ) Notice: Subject to any disclaimer, the term of this patent is extended or adjusted under 35 U.S.C. 154(b) by 0 days.

(21) Appl. No.: 09/374,257

(22) Filed: Aug. 13, 1999

(30) Foreign Application Priority Data

Aug. 25, 1998 (JP) ............................................. 10-238382

(51) Int. Cl.$^7$ ................................. C09J 7/02; B32B 7/12
(52) U.S. Cl. ........................ 428/343; 428/346; 428/354; 428/355 EP; 428/355 CN; 427/208
(58) Field of Search ................................. 428/343, 346, 428/354, 355 EP, 355 CN; 427/208

(56) References Cited

U.S. PATENT DOCUMENTS

| | | | |
|---|---|---|---|
| 5,151,327 A | * | 9/1992 | Nishiyama et al. .......... 428/343 |
| 5,523,137 A | * | 6/1996 | Sei et al. .................... 428/41.7 |
| 5,843,550 A | * | 12/1998 | Sei et al. .................... 428/41.7 |
| 5,945,188 A | * | 8/1999 | Sei et al. .................... 428/41.7 |

* cited by examiner

*Primary Examiner*—Daniel Zirker
(74) *Attorney, Agent, or Firm*—Scully, Scott, Murphy & Presser

(57) ABSTRACT

The present invention provides an adhesive film for electronic parts, for example, an adhesive agent in a tape BGA (Ball Grid Array) or µ-BGA (trade name) package, in which embedding and adhesion to copper patterns on circuit boards are excellent, in which feeding and punching quality in the film state are superior, and which can reduce stress caused by thermal expansion difference between a circuit board and a reinforcing metal board or an IC chip. Adhesive film for electronic parts comprises a resin layer in which the dynamic modulus of elasticity at −30 to 125° C. is from 1 to 30 MPa and adhesive layers are coated on surfaces of the resin layer.

16 Claims, 2 Drawing Sheets

ADHESIVE FILM FOR ELECTRONIC PARTS

BACKGROUND OF THE INVENTION

The present invention relates to an adhesive film for electronic parts, for example, an adhesive film for electronic parts in a tape BGA (Ball Grid Array) or a µ-BGA (trade name), for adhering a circuit board to an IC chip or to a reinforcing metal board, for adhering an IC chip to an IC chip, and for reducing stress caused by thermal expansion difference between a circuit board and an IC chip or a reinforcing metal board.

Recently, µ-BGA (produced by Tessera Inc.) and tape BGA packages have drawn attention due to the high speed property thereof, applicability to many pin forms, or the like, as packages for semiconductor memory or packages for ASIC, etc. The µ-BGA is produced by bonding an IC chip to a flexible tape substrate via an adhesive layer and by attaching soldering balls thereto. The tape BGA is produced by bonding a reinforcing metal board to a flexible tape substrate via an adhesive layer and by attaching soldering balls thereto. These packages must act to reduce stress caused by thermal expansion difference between a circuit board and an IC chip or a reinforcing metal board.

As a convenient adhesive agent for reducing stress in the µ-BGA, silicone type resin is employed. For example, liquid silicone resin is printed on a circuit board, an IC chip is adhered on a surface thereof, and the silicone resin is cured by heating. Thereafter, this laminate is sealed by resin, thereby completing an IC package. However, in the case in which the silicone resin is printed, since it is difficult to obtain uniformity of printing amount (thickness, etc.), productivity is low, or the like, and an adhesive agent shaped as a film is preferably employed. The adhesive film must be in a semi-cured state (hereinafter, this stage of the thermosetting resin is referred to as the "B-stage") so as to facilitate handling. In order to adhere by an adhesive film in the B-stage, this film is punched out in a specific shape by a die, is mounted on a tape substrate, is pressed thereon on an IC chip, and is cured by heating. Thereafter, this laminate is sealed by resin, thereby completing an IC package. As an adhesive film, in addition to silicone resin film, a B-stage adhesive film consisting of butyl acrylate/phenol resin/epoxy resin as a base component, and a B-stage adhesive film consisting of butyl acrylate/phenol resin/epoxy resin as a base component, are provided on surfaces of a polyimide film, such as Upilex film, produced by Ube Industries, Ltd., or Kapton E type produced by Du Pont-Toray Co., Ltd., or the like.

For example, the silicone resin is characterized in that its melting point is in the vicinity of −50 °C. and its elastic modulus change depending on temperature change is small. Therefore, it is said that the µ-BGA employing the silicone resin causes few problems such as imperfect joining, short circuiting, etc. in ball junctions or copper leads in thermal cycle tests that test the reliability of IC chips. However, since conventional silicone resin film is produced by interrupting a reaction in the step of curing liquid silicone by heating, it is difficult to produce a constant semi-cured state thereof. Copper patterns formed on a circuit board must be embedded so that unevenness thereof is filled with resin. In the case in which embedding in resin is not adequate, moisture, etc., may seep into a space between a surface and the resin and be rapidly expanded by heating (solder reflow) when a package is assembled on a motherboard, whereby a steam explosion (popcorn phenomenon) may occur, resulting in destruction of the package, loss of flatness, distortion, or the like, and further contact of solder balls or imperfect contact with the motherboard, etc., may occur. However, it is difficult to embed a copper pattern since silicone resin film which is cross-linked to some degree is approximately an elastic body. As a result, it is necessary to heat it to a high temperature of 200° C. or more. In the case in which cross-linking thereof is restricted so as to improved embedding, since silicone resin has a low molecular weight and is fluid, it may be difficult to control the thickness of the silicone film, the adhesive area on a tape, etc. In addition, since restricted cross-linking silicone resin is very soft, accuracy of punching by a die and adhesion of resin to the die may be problems. Furthermore, since a silicone resin film is continuously processed while feeding, it is necessary to restrict adhesion at ordinary temperatures, whereby it may be difficult to adjust the processing during feeding in the semi-cured state.

With respect to a B-stage thermosetting adhesive film consisting of butyl acrylate/phenol resin/epoxy resin as a base component, the thickness of an adhesive layer is required to be about 150 to 200 µm so as to allow copper leads to be bent into a S-shape. The B-stage adhesive film consisting of butyl acrylate/phenol resin/epoxy resin as a base component is soft at ordinary temperatures, so there is a problem in that punching quality by a die may be inferior. In an adhesive film provided with B-stage adhesive films consisting of butyl acrylate/phenol resin/epoxy resin as a base component on both surfaces of a polyimide film, imperfect contact at solder ball joint portions, short circuiting at copper leads, etc., readily occur in reliability tests of IC packages, for example, in thermal cycle tests at about −30 to 120° C.

Furthermore, with respect to the tape BGA, there is a problem in that electrical resistance rises at solder ball joint portions in thermal cycle tests after assembly on a substrate. This stress at solder ball joint portions in thermal cycle tests is also caused by thermal expansion difference among a reinforcing metal board, an organic film of a tape substrate, and a circuit board.

SUMMARY OF THE INVENTION

Therefore, it is an object of the present invention to provide an adhesive film for electronic parts, for example, an adhesive agent in a µ-BGA (trade name) or a tape BGA package, in which the embedding and the adhesion to a copper pattern on a circuit board are superior, in which feeding and punching quality in the film state are superior, and which can reduce stress caused by thermal expansion difference between a circuit board and a reinforcing metal board or an IC chip.

According to the results that the inventor has obtained from various research with regard to adhesive films for electronic parts, in which punching quality, feeding, and embedding are superior, and in which stress reduction is sufficient, the above properties are divided into each layer by providing adhesive layers on both surfaces of a resin layer, thereby attaining the present invention. Since the results quantitatively analyzed properties of an adhesive layer by which embedding a copper pattern is superior and feeding in a production device is smooth, the inventor has found that the above properties are satisfied when the dynamic modulus of elasticity at −30 to 125° C. of a resin layer provided in an adhesive film ranges from 1 to 30 MPa. Therefore, the adhesive film for electronic parts according to the present invention is characterized by comprising a resin layer in which the dynamic modulus of elasticity at −30 to 125° C. ranges from 1 to 30 MPa.

In addition, the adhesive film for electronic parts according to the present invention is preferably that an adhesive agent for forming the adhesive layer has a melting temperature ranging from 50 to 200° C. In the case in which the melting temperature of the above adhesive agent is 200° C. or more, an adhesive layer must be adhered to a circuit board, an IC chip, or a metal board by heating to a high temperature since inadequate embedding is readily caused, whereby the following problems may be arise.

① A circuit board is distorted by heating, and a protective film provided on a surface of an adhesive layer shrinks by heating, whereby it is difficult to control the adhesive area.

② An adhesive agent employed in a circuit board is spread out by thermal expansion, whereby leads are contaminated and adhesion of an adhesive layer on a circuit board are decreased.

③ Moisture evaporated from a circuit board enters into an adhesive layer, whereby pores (voids) are produced in the adhesive layer.

④ Since thermal expansion difference between a circuit board and an IC chip is large when the IC chip is adhered to an adhesive layer by heating, in the case in which a package is produced by sealing resin in this state, distortion and internal stress therein remain in the package.

⑤ A partial curing reaction occurs (for example, at a surface portion) when an adhesive layer is heated, whereby adhesion to an IC chip is decreased.

In the case in which the melting temperature of the above adhesive agent is 50° C. or less, adhesion appears in an adhesive layer at ordinary temperatures and resin flow is readily caused, whereby punching quality and feeding is impaired. In the case in which the adhesive layer consists of a thermosetting adhesive agent, when the layer is rapidly adhered in an uncured state by heating, moisture readily evaporates from a circuit board and enters into the uncured adhesive layer, whereby voids easily form. Since this adhering by heating must therefore be performed over a long period so that moisture from a circuit board is evaporated after curing the adhesive layer, it is not practical.

DETAILED DESCRIPTION OF THE PREFERRED EMBODIMENTS

Figure 1:
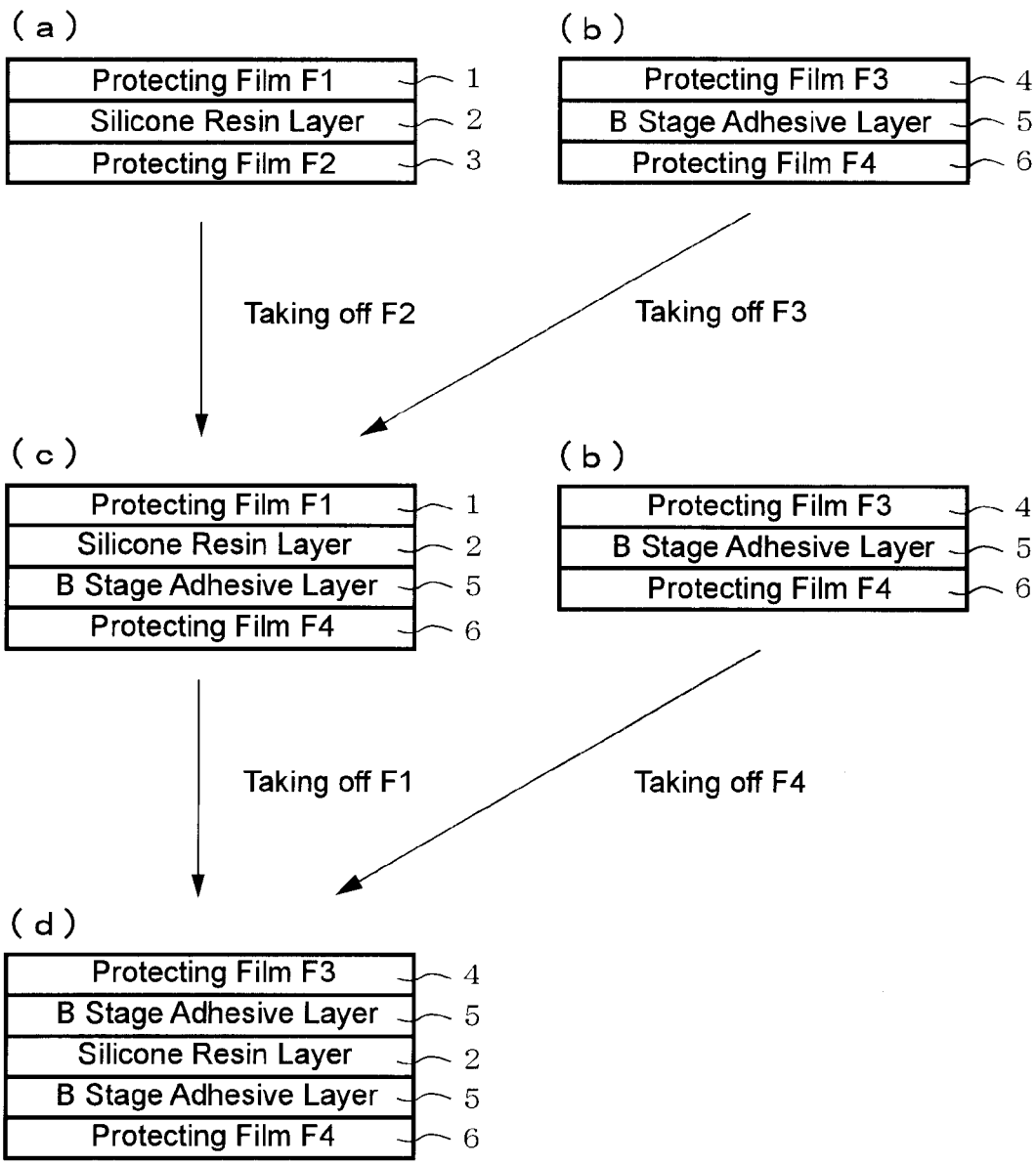
FIG. 1 is a diagram showing steps for forming the adhesive film for electronic parts of Example 1 according to the present invention.

In the following, preferred embodiments according to the present invention will be explained in detail.

As a resin for a resin layer according to the present invention, silicone rubber, fluorosilicone rubber, butadiene rubber, fluoro rubber, butyl rubber, styrene butadiene rubber, nitrile rubber, acrylic rubber, or the like, may be employed. In particular, silicone rubber, fluorosilicone rubber, butadiene rubber, and butyl rubber may be preferably employed since the glass transition temperature are −50° C. or the less, and silicone type resins such as silicone rubber, fluorosilicone rubber, or the like may be more preferably employed. These resins must satisfy the above dynamic modulus of elasticity at −30 to 125° C. The dynamic modulus of elasticity is preferably 1 to 20 MPa, and more preferably 1 to 10 MPa. In the case in which the dynamic modulus of elasticity is 30 MPa or more, stress caused by thermal expansion difference between an IC chip and a circuit board in a thermal cycle test cannot be reduced.

As a silicone rubber, cross-linking compounds such as mirable type silicone or liquid silicone, or the like may be employed. A principal material in mirable type silicone is linear polyorganosiloxane having a high degree of polymerization in which the molecular weight is about $3 \times 10^5$ to $8 \times 10^5$. This cross-linking is performed by a radical reaction caused by organic peroxides, or by an addition reaction caused by a platinum compound as a cross-linking catalyst. As a principal material of silicone, dimethyl type, methylvinyl type, methylphenyl type, fluorosilicone type, or the like may be mentioned. As liquid silicone, the condensation type or addition type may be mentioned. Silicone chains are cross-linked by additionally reacting polysiloxane having vinyl groups and polysiloxane having Si—H groups, thereby obtaining the addition type. A principal component of the condensation type can be obtained by hydrolysis condensation reaction of silanol (HOSi—SiOH) and a cross-linking agent (Si—X). In these silicone resins, curing catalysts, fillers (fume type silica, ground silica, calcium carbonate powder, quartz powder, or the like), and adducts (adhesive improvers, or the like) are added. Silica, calcium carbonate, or the like, produced as wet types or fume types, may be employed as fillers, and tackifiers, heat resisting improvers such as iron oxides or the like, flame retarders such as iron oxides, titanium oxides, or the like, may be added.

Considering the adhesion of sealing resins, filler is desirably added therein, and the filler is more desirably added at 2% or more by weight. The dynamic modulus of elasticity of silicone resin may be changed according to the structure of the above materials, addition amounts of the fillers, or contained amounts of vinyl groups.

Butadiene rubber and butyl rubber may be employed as components known to have the above dynamic modulus of elasticity.

Silicone type rubber, butadiene rubber, and butyl rubber are effective for high-speed signal transmission since polarity is small and permittivity is low. In particular, a resin in which permittivity is 3 or less (100 MHz) is preferably employed. It is desirable that these resins have coefficients of thermal expansion of 300° $C.^{-1}$ (=300 ppm,=$3 \times 10^{-4}$ cm/cm/° C.) or less and more preferably 50 to 300° $C.^{-1}$ at −30 to 125° C. When the coefficient of thermal expansion is high, stress caused by thermal expansion of the resin is high, whereby stress reduction effects are not obtained. Furthermore, the above resin having small polarity has problems in that adhesion to other resins is low. Therefore, in order to improve the adhesion of the adhesive agent to the resin layer, surface treatment of the resin layer, such as coronal discharge, plasma discharge, or the like, or primer treatment of the silicone rubber type, is desirably performed. These treatments can also prevent the adhesion of the above resin layer and the adhesive layer from being degradated at high temperature and high humidity.

The coefficient of thermal expansion is obtained by measuring the change in size of a sample at a rate of temperature increase of 3° C./min; load in air: 10 mN, using a thermal expansion analytical device (trade name: TMA-7; produced by Perkin-Elmer Co., Ltd.). Samples for testing were 25 to 1000 μm thick; 1 to 5 cm long; and 3 to 5 mm wide. In the case in which sample length is $L_0$, the change in size of a sample during temperature change $\Delta T$ is $\Delta L$, and the coefficient of thermal expansion is obtained by the following equation.

Coefficient of thermal expansion $= \Delta L/(L_0 \cdot \Delta T)$

In an adhesive film according to the present invention, a thermosetting adhesive agent or a thermoplastic adhesive agent may be employed, and the melting temperature of the resin must be between 50 and 200° C. In particular, the thermosetting adhesive agent is preferably employed, and more preferably employed in the B-stage state in the present invention, by being adhered to a circuit board and then being adhered to an IC chip, so that the electronic parts can be bonded by curing the resin.

In a thermosetting adhesive agent, at least epoxy resin or phenol resin is desirably contained, whereby heat resistance is improved. At least one compound of polyimide resin, polyamide resin, acrylonitrile-butadiene rubber, and polyester resin is desirably contained, whereby flexibility is provided. Although these resins providing flexibility need not react with epoxy resin or phenol resin mixed therewith, heat resistance can be improved by adding functional groups such as carboxyl groups, amino groups, hydroxyl groups, or the like to side chains or terminals of the resin providing the flexibility. In the following, these resins will be explained in detail.

As epoxy resins, bisphenol-A type glycidylether, phenol novolak type epoxy resin, ortho-cresol type epoxy resin, and triphenylmethane type epoxy resins are desirably employed. Furthermore, known epoxy resins such as the bisphenol-F type, bisphenol-S type, naphthalene type, modified dimeric acids, modified silicone, modified acrylonitrile-butadiene rubber, or the like, may be employed. The curing agent for the epoxy resin is desirably used therewith.

As phenol resins, known phenol resins such as the self-cross-linking type of resol type phenol resin, non-self-cross-linking type of novolak phenol resin employed with epoxy resin, or the like, may be employed. Novolak phenol resin or resol type resin of the bisphenol-A type, para-tertiary-butyl type, or copolymer thereof, is desirably employed.

As polyamide resins, aliphatic polyamide resins comprising carboxylic acids having 36 carbon atoms and diamines such as hexamethylenediamine, etc., may preferably be employed since water absorbency is low, insulation is high, and they are soluble in common solvents such as alcohol, etc., whereby handling is facilitated. Polyamide resin copolymerized by 6-nylon and 6,6-nylon may also be preferably employed. It is effective with respect to improvement of heat resistance that the polyamide resins have added functional groups reactive with epoxy resin, etc. For example, carboxylic acids having 36 carbon atoms and diamines are synthesized at molar ratios of 1.5 to 1.01:1.01 to 1.5, whereby primary amino groups or carboxylic acids remain at the terminals of the molecules, so that polyamide resins having reactivity suitable for this purpose can be obtained. Trimer acids, triamines, or the like may be added to the dicarboxylic acids and diamines, whereby branches are formed as side chains of the molecule, so that multifunctional polyamide resins can also be obtained. The above obtained polyamide resins in which the weight average molecular weight ranges from about 4000 to 100000 may be employed. Resins in which the melting points range from 60 to 180° C. are desirably employed.

The above weight average molecular weight was measured at flow rates of 0.1 mL/min, using gel permeation chromatography (trade name: 880-PU (pump), SHODEX DEGAS (degasser), 875-UV (UV detector), RI-SE61 (RI); produced by JASCO Corporation). At this time, the resin was dissolved in THF at a 0.1% solid content solution. Molecular weight was calculated by styrene conversion.

The above melting point was measured by the ball-and-ring method. This measurement was applied using the Japanese Industrial Standard K2207.

As polyimide resins, for example, polyimide resins having randomly arranged structural units shown in the following chemical formulas (1) and (2) may be employed. The polyimide resins are not limited to one kind. Molecular weights of the resins preferably range from about 3000 to 180000, and more preferably from about 5000 to 150000.

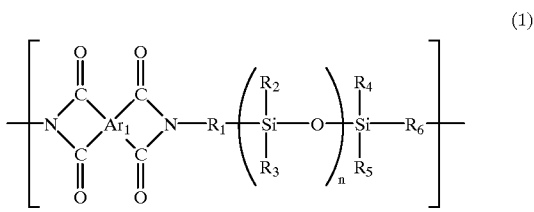

(1)

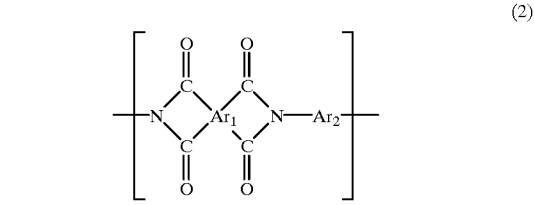

(2)

In the formulas, $Ar_1$ represents tetravalent aromatic groups shown in the following formulas (3) to (6); $Ar_2$ represents divalent aromatic groups shown in the following formulas (7) and (8); $R_1$ and $R_6$ represent alkylene groups having one to four carbon atoms or aromatic groups shown in the following formula (9); $R_2$ to $R_5$ represent alkyl groups having one to four carbon atoms; and n represents an integer from 1 to 32.

(3)

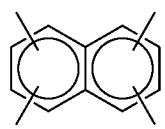

(4)

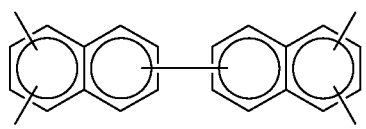

(5)

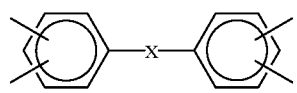

(6)

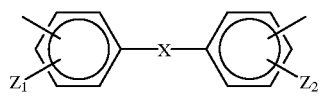

(7)

-continued

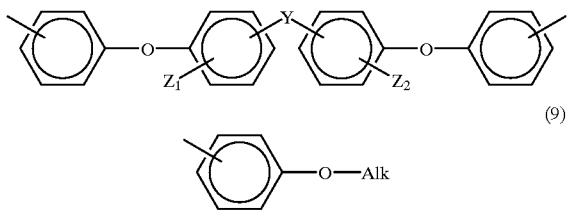

(8)

(9)

In the formulas, X represents an alkylene group having one to four carbon atoms, —O—, —$SO_2$—, or —CO—; Y represents an alkylene group having one to four carbon atoms; $Z_1$ and $Z_2$ represent a hydrogen atom, a halogen atom, an alkyl group having one to four carbon atoms, an alkoxyl group having one to four carbon atoms, an hydroxyl group, or a carboxyl group. Alk represents an alkylene group bonding to a silicon atom and having one to four carbon atoms.

As an acrylonitrile-butadiene rubber, that in which acrylonitrile is contained at 10 to 40 mole %, may preferably be employed. In the case in which acrylonitrile is contained at 10 mole % or less, use thereof is not practical since compatibility with epoxy resin, etc., is poor, and in the case where it is 40 mole % or more, solubility in solvent is poor. An acrylonitrile-butadiene rubber containing carboxyl groups, amino groups, or vinyl groups in molecular side chain may also be employed.

Polyester resin can be produced by polybasic acid and polyhydric alcohol. As a polybasic acid, terephthalic acid, isophthalic acid, phthalic anhydride, adipic acid, azelaic acid, or the like, may be employed. As a polyhydric alcohol, ethylene glycol, propylene glycol, diethylene glycol, or the like, may be employed. Since this resin has hydroxyl groups, carboxyl groups, etc., at side chains, terminals, etc. of the molecule, these functional groups can be reacted with epoxy resin, etc., whereby heat resistance thereof can be further improved.

As resins other than the above resins, bismaleimide resin having two maleimide groups, melamine resin, styrene-butadiene resin, butyral resin, and mixtures of the above mentioned resins may be mentioned. Organic or inorganic fillers may also be contained. As an inorganic filler, ground silica, fused silica, alumina, titanium oxide, beryllium oxide, magnesium oxide, silicon nitride, boron nitride, or the like may be employed, whereby heat conductivity can be improved. When insulation is not necessary, metal powder may be contained. These fillers are effective not for improvement in heat conductivity, but for decreasing of the coefficient of thermal expansion. Inorganic filler having low levels of radioactivity is desirably employed.

In an adhesive layer, thermoplastic adhesive agents may be employed. As thermoplastic adhesive agents, those with glass transition temperature (Tg) ranging from 30 to 180° C. are preferably employed; for example, thermoplastic polyimide resin shown in the chemical formulas (1) and/or (2), or polyolefin type resins such as ternary copolymers consisting of polyethylene, ethyl acrylate, and maleic anhydride, copolymers consisting of ethylene and glycidyl methacrylate, or the like, may be employed. In particular, polyimide resin is desirably employed since heat resistance is very superior.

Total thickness of these adhesive layers and resin layers is generally 100 to 250 μm. In the case in which the adhesive film is to be adhered to a conductor on a patterned surface of a circuit board, the thickness of the adhesive layer must be 10 μm or more, but depends on the thickness of the pattern. The resin layer in the middle of the film is required to reduce stress, and the thickness of the resin layer must be 20 μm or more. Considering the above, the ratio of the thickness of the stress reduction resin layer in the present adhesive film is preferably from 10 to 90%, and more preferably 30 to 70%. In the case in which the thickness of the resin layer is 10% or less, the stress reduction effect is slight. When the thickness is 90% or more, problems arise in the punching quality by the die and the embedding of the pattern on the circuit board.

In the present invention, components of the adhesive layers provided on the surfaces of the resin layer may be different. Therefore, thermosetting adhesive agents may be combined with thermoplastic adhesive agents, and different thermosetting adhesive agents may be employed. In particular, in the case of μ-BGA, since the adhesive agent must securely affix a TAB (Tape Automated Bonding) tape during and after a step of adhering the film to the TAB tape to a step of adhering to an IC chip, an adhesive agent adhering to the TAB tape side is preferably a thermosetting adhesive agent, and an adhesive agent adhering to the IC chip side is preferably a thermoplastic adhesive agent.

Oligomer components contained in silicone rubber are preferably removed beforehand since they readily evaporate as gas in the heating step in the assembly of a semiconductor package. For example, it is desirably that the content of oligomer components up to decamers be 1% or less, more preferably 0.5% or less, and most desirably 0.1% or less.

The adhesive film for electronic parts is provided with a protective film for preventing dust, etc., from adhering during the step of conveyance, etc. As a protective film, PET film, polypropylene film, polyethylene film, fluorinated PET film, siliconized PET film, fluoride type film such as polytetrafluoroethylene, etc., may be employed. In adhering to a circuit board or in assembling an IC chip, these protective films are taken off so that the adhesive film can be used.

Dynamic modulus of elasticity of the resin layer and melting temperature of the adhesive film are measured by the following methods.

Dynamic modulus of elasticity is measured at a rate of temperature increase of 3° C./min; load power at 11 Hz in air: 5 g; using a measuring instrument for the dynamic modulus of elasticity (trade name: Leovibron DDV-01FP; produced by Orientech Co., Ltd.). Samples to be measured were 100 to 1000 μm thick; 0.5 to 1.5 cm long; and 3 to 5 mm wide.

A copper foil (trade name: 3EC-VLP 25 μm; produced by Mitsui Mining and Smelting Co., Ltd.) was provided on one surface of the adhesive film and a polyester film of 25 μm was provided on the other surface thereof. This was laminated at a line pressure of 2 kg/cm, at a speed of 1 m/min, using a laminator comprising two silicone rubber rollers having a rubber hardness of 70 at the upper and lower sides. Surface temperature of these rollers refers to the laminate temperature of the prepared sample. Reflectivity at the adhesive film surface of this sample was measured by RD914 produced by Macbeth Co., Ltd. With respect to the measured results, lamination temperatures and Macbeth concentrations are plotted on the X-axis and the Y-axis, respectively, and lamination temperatures in which Macbeth concentration is constant indicates the melting temperature of a sample, which was so measured.

EXAMPLE

Examples according to the present invention will be explained in detail. However, the invention is not intended to be limited to these specific embodiments. First, the adhesive films for electronic parts of Examples 1 to 4 below were produced as the adhesive film for electronic parts according to the present invention, while the adhesive films for electronic parts of Comparative Examples 1 to 3 below were produced for comparison.

Example 1

In the following, examples according to the present invention will be described with reference to FIGS. 1 to 3. FIG. 1 is a schematic illustration showing steps for forming the adhesive film for electronic parts of Example 1 according to the present invention. In the figure, (a) is cross-section showing a film of cross-linked silicone rubber, (b) is cross-section showing a B-stage adhesive film, (c) is cross-section showing a film comprised of protective film, silicone resin layer, B-stage adhesive layer, and protective film, and (d) is cross-section showing adhesive films of Examples 1 and 3 according to the present invention. Reference numerals 1, 3, 4, and 6 refer to protective film, and reference numerals 2 and 5 refer to the silicone resin layer and the B-stage adhesive layer, respectively. One solution type of silicon resin (trade name: TSE3221, produced by Toshiba Silicone Co., Ltd.) (2) was coated on a surface of protective film F1 (1) so that the dried thickness of the layer was 100 $\mu$m, after heating at 150° C. for 10 min, a protective film F2 (3) was adhered to the surface of protective film F1 (1), whereby a cross-linked silicone rubber film shown by (a) was produced. TSE3221 is an addition type of liquid silicone resin and had a dynamic modulus of elasticity at −30 to 125° C. of from 2 to 7 MPa. Coefficient of thermal expansion at −30 to 125° C. in the resin layer was 200° C.$^{-1}$. Thereafter, the materials below for forming the B-stage adhesive layer (5) were mixed and coated on a surface of protective film F3 (4) so that the thickness of the layer was 25 $\mu$m, and after drying, a protective film F4 (6) was adhered to the surface of protective film F3 (4), whereby a B-stage adhesive film shown by (b) was produced.

- Polyamide resin, 200 weight parts (trade name: Macro-Melt 6900; 25% solid content solution in mixed solvent of isopropyl alcohol and toluene (1/1); produced by Henkel Japan Co., Ltd.)
- Epoxy resin, 33 weight parts (trade name: Epikote 828; 100% solid content; produced by Yuka Shell Epoxy, Inc.)
- Phenol resin, 34 weight parts (trade name: Malker-Linker RM-H2P; 50% solid content solution in methylethylketone; produced by Maruzen Petrochemical Co., Ltd.)
- Imidazole, 30 weight parts (trade name: 2-ethyl-4-methylimidazole; 1% solid content solution in methylethylketone; produced by Wako Pure Chemical Industries, Ltd.)

In a step in FIG. 1, the adhesive film shown by (d) was produced. Melting temperature of the above adhesive agent was 120° C. The above adhesive film was cured at 160° C. for 1 hour.

Example 2

Using toluene solution of butadiene resin (trade name: NIPOL BR-1220; produced by Nippon Zeon Co., Ltd.) and benzoyl peroxide instead of one solution type of silicon resin TSE3221, the adhesive film shown by (d) according to the present invention was produced in a manner similar to that in Example 1, with the exception that the materials below were used for forming the B-stage adhesive layer (5). Dynamic modulus of elasticity and coefficient of thermal expansion at −30 to 125° C. in the resin layer ranged from 4 to 15 MPa and was 250$^{-1}$, respectively. Melting temperature of the adhesive agent below was 100° C.

- Acrylonitrile-butadiene resin containing carboxyl groups, 500 weight parts (trade name: PNR1H; 20% solid content solution in methylethylketone; produced by Japan Synthetic Rubber Co., Ltd.)
- Epoxy resin, 100 weight parts (trade name: EOCN1020; 50% solid content solution in methylethylketone; produced by Nippon Kayaku Co., Ltd.)
- Phenol resin, 100 weight parts (trade name: Shonol CKM2432 (para-tertiary-butyl type); 50% solid content solution in methylethylketone; produced by Showa Highpolymer Co., Ltd.)
- Imidazole, 30 weight parts (trade name: 2-ethyl-4-methylimidazole; 1% solid content solution in methylethylketone; produced by Wako Pure Chemical Industries, Ltd.)

This adhesive film was cured at 150° C. for 1 hour.

Example 3

With the exception that the polyimide resin below was used for forming the B-stage adhesive layer (5) instead of the polyamide resin of Example 1, the adhesive film shown by (d) according to the present invention was produced in a manner similar to that in Example 1. Biphenyl tetracarboxylic dianhydride, 2,2-bis{4-(4-aminophenoxy) phenyl} propane and 1,3-bis-(3-aminopropyl) tetramethyl disiloxane in which the polymerization degree was 8 were polymerized in NMP, and then solvent was substituted for THF, whereby a polyimide resin was prepared. The resin had a modification degree of siloxane of about 18% and Tg of about 130° C. Dynamic modulus of elasticity and coefficient of thermal expansion at −30 to 125° C. in the resin layer ranged from 2 to 7 MPa and was 200° C.$^{-1}$, respectively. Melting temperature of the adhesive agent obtained as above was 150° C.

Example 4

Figure 2:
FIG. 2 is an illustration showing lamination of the adhesive film for electronic parts of Example 4 according to the present invention.

FIG. 2 is an illustration showing lamination of the adhesive film of Example 4 according to the present invention. In the figure, reference numerals 7, 8, and 9 refer to protective film, polyimide resin layer, and silicone resin layer, respectively. The silicone resin was similar to those of Example 1. The polyimide resin was prepared in a manner similar to that in Example 3; however, the resin had modification degree of siloxane of about 20% and Tg of about 50° C. Dynamic modulus of elasticity and coefficient of thermal expansion at −30 to 125° C. in the resin layer ranged from 2 to 7 MPa and was 200° C.$^{-1}$, respectively. Melting temperature of this thermosetting adhesive agent was 150° C.

Comparative Example 1

A cross-linked silicone rubber film shown by (a) employed in Example 1 was produced so that the dried thickness of the layer was 150 $\mu$m; thereafter, an adhesive film of Comparative Example 1 was produced by heating at 150° C. for 5 min. Dynamic modulus of elasticity and coefficient of thermal expansion at −30 to 125° C. in the resin layer ranged from 2 to 7 MPa and was 200° C.$^{-1}$, respectively.

Comparative Example 2

With the exception that the polyimide film having a thickness of 125 μm (trade name: Upilex S; produced by Ube Industries, Ltd.) is used instead of a cross-linked silicone rubber film employed in Example 1, the adhesive film of Comparative Example 2 was produced in a manner similar to that in Example 1. Dynamic modulus of elasticity and coefficient of thermal expansion at −30 to 125° C. in the resin layer was 2000 MPa and 250° C.$^{-1}$, respectively. Melting temperature of the adhesive agent was 120° C.

With regard to each adhesive film of the above Examples and Comparative Examples, the following tests were performed.

① Quality of Punching by the Die

A parting mold, 10 by 10 mm square, of each adhesive film of the Examples and the Comparative Examples was produced by a die. With regard to punching quality of this parting mold, presence of burrs in punching, peeling off of protective film, adhesion of resins, and the like were evaluated.

② Tack and Feeding at Ordinary Temperatures

Two adhesive films, 2 by 10 cm, of each Example or Comparative Example were produced. These films were stacked up 4 cm² of each adhesive surface, and were adhered at ordinary temperatures. Then, each film was tested by a shear tensile test, and it was determined whether shearing adhesion (tack) was 100 g or more. This measurement was performed at a tensile speed of 1 cm/min by a tensile tester (trade name: Autograph AGS-100B; produced by Shimadzu Corporation). Feeding was evaluated by feeding these adhesive films on metal plates at ordinary temperatures.

③ Embedding of Patterns

An adhesive film of each Example and Comparative Example was adhered to copper patterns having thicknesses of 25 μm formed at 200 μm pitch (conductor width of 100 μm) on the insulating film, and the temperature at which the patterns were sufficiently embedded was measured. Embedding of patterns was evaluated by observing sections thereof. Resin flow adhering was evaluated at which it was suitable that the ratio of the area after adhering of adhesive film of 1 cm² punched by a die to an area before adhering ranged from 0.95 to 1.05. The test was performed for an adhesive time of 3 seconds, pressure of 10 kg/cm², and testing temperature below 250° C.

④ Stress Reduction Effect

Figure 3:
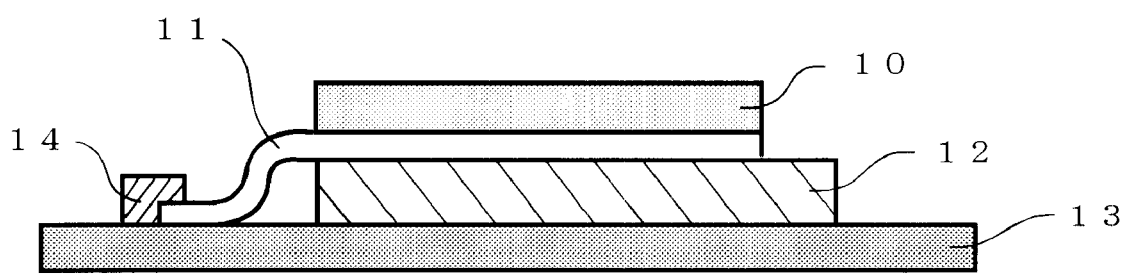
FIG. 3 is a cross section showing a sample for testing the stress reduction effects.

A sample having a lamination shown in FIG. 3 was produced and was tested with regard to stress reduction effects. In the figure, reference numerals 10, 11, 12, 13, and 14 refer to the circuit pattern, copper pattern, adhesive film, glass substrate, and resin for fixing the copper pattern, respectively. A circuit pattern 10 was adhered to a glass substrate 13 by an adhesive film 12, and an edge portion of a copper pattern 11 extending from the circuit pattern 10 was adhered to the glass substrate 13 by resin 14. Samples having this lamination used the adhesive film 12 of each Example and Comparative Example were subjected to heat cycle tests maintained at −50° C. for 1 hour, and at 120° C. for 1 hour, for 100 cycles, whereby breaking or rupture of the copper pattern 11 was determined. Adhesive tape for TAB (produced by Tomoegawa Paper Co., Ltd.) as base material was adhered to 3EC-VLP 25 μm (produced by Mitsui Mining and Smelting Co., Ltd.), and the adhesive film was cured, whereby a circuit pattern 10 was produced. The pitch width of the circuit pattern 10 was 100 μm.

⑤ Adhesion to Circuit Patterns

Circuit patterns were produced in a similar manner as for the circuit patterns 10 used in the above test ④. The circuit patterns were adhered to an adhesive film of each Example and Comparative Example, whereby samples for testing were produced. Then, each sample was subjected to tensile tests by tensing toward the vertical direction of the TAB tape at 10 mm/1 min, thereby measuring adhesive strength. The thermosetting adhesive agents were cured at the above described curing tempertature, and the Comparative Examples were cured at 150° C. for 30 min. This measurement was performed by a tensile tester (trade name: Autograph AGS-100B; produced by Shimadzu Corporation). The result of the above tests are shown on Table 1.

TABLE 1

|  | Example 1 | Example 2 | Example 3 | Example 4 | Comparative Example 1 | Comparative Example 2 |
|---|---|---|---|---|---|---|
| Adhesive Agent | Polyamide/ Epoxy Type | NBR/ Epoxy Type | Polyimide/ Epoxy Type | Polyimide Type | — | Polyamide/ Epoxy Type |
| Melting Temperature of Adhesive Agent (° C.) | 120 | 100 | 150 | 150 | — | 120 |
| Resin Layer | Silicone Rubber | Butadiene Rubber | Silicone Rubber | Silicone Rubber | Silicone Rubber | Polyimide |
| Coefficient of Thermal Expansion of Resin Layer (° C.$^{-1}$) | 200 | 250 | 200 | 200 | 200 | 15 |
| Dynamic Modulus of Elasticity in Resin Layer (MPa) | 2 ~ 7 | 4 ~ 15 | 2 ~ 7 | 2 ~ 7 | 2 ~ 7 | 2000 |
| Punching Quality | No Burr, No Adhesion of Resin | No Burr, No Adhesion of Resin | No Burr, No Adhesion of Resin | No Burr, No Adhesion of Resin | Having Burr Not punched in form No Adhesion of Resin | No Burr No Adhesion of Resin |
| Tack and Feeding | No Adhesion Good Feeding | No Adhesion Good Feeding | No Adhesion Good Feeding | No Adhesion Good Feeding | Adheres Bad Feeding at 100 g or more | No Adhesion Good Feeding |
| Embedding Temperature (° C.) | 130 | 110 | 160 | 180 | Cannot bury | 130 |
| Flow | 1.02 | 1.02 | 1.01 | 1.04 | 0.98 | 1.02 |
| Stress Reduction Effect | No Rupture | No Rupture | No Rupture | No Rupture | No Rupture | Rupture |
| Adhesion to Circuit Board (g/cm) | 800 | 1200 | 700 | 500 | 10 | 800 |

As is apparent from the results shown in Table 1, each Example of the adhesive films for electronic parts according to the present invention was confirmed to have sufficient stress reduction effects and to be superior adhesive films with respect to punching quality, feeding, embedding, and adhesion. In contrast, although the Comparative Example 1 comprising a silicone layer had the stress reduction effects, the other results were not satisfactory in practice. With regard to the Comparative Example 2 having a resin layer consisting of polyimide, the stress reduction effects was inferior. Therefore, the effects of the present invention are clear.

As explained above, according to the present invention, since resin in which the dynamic modulus of elasticity at −30 to 125° C. is from 1 to 30 MPa is employed as a stress reducing resin, the adhesive film for electronic parts can have sufficient stress reduction effects and can be superior with respect to punching quality, feeding and embedding.

What is claimed is:

1. Adhesive film for electronic parts comprising:

a resin layer having a dynamic modulus of elasticity at −30 to 125° C. of from 1 to 30 MPa, and an adhesive layer provided on both surfaces of said resin layer.

2. Adhesive film for electronic parts as recited in claim 1, wherein said resin layer comprises at least one resin selected from the group consisting of butadiene rubber, butyl rubber and silicone resin.

3. Adhesive film for electronic parts as recited in claim 1, wherein said resin layer has a coefficient of thermal expansion not more than $300° C.^{-1}$ at −30 to 125° C.

4. Adhesive film for electronic parts as recited in claim 1, wherein an adhesive agent for forming said adhesive layer has a melting temperature between 50 and 200° C.

5. Adhesive film for electronic parts as recited in claim 1, wherein said at least one adhesive layer comprises a thermosetting resin.

6. Adhesive film for electronic parts as recited in claim 5, wherein said thermosetting resin comprises at least one of epoxy resin and phenol resin.

7. Adhesive film for electronic parts as recited in claim 1, wherein said adhesive layer comprises a thermosetting resin and at least one resin selected from the group consisting of polyimide resin, polyamide resin, acrylonitrile-butadiene rubber and polyester resin.

8. Adhesive film for electronic parts as recited in claim 1, wherein said adhesive film adheres one of an IC chip and a reinforcing metal board to a circuit board.

9. Adhesive film for electronic parts are recited in claim 1, wherein said adhesive film adheres an IC chip to an IC chip.

10. Adhesive film for electronic parts comprising:

a resin layer which comprises at least one resin selected from the group consisting of butadiene rubber, butyl rubber and silicon resin, and an adhesive layer provided on both surfaces of said resin layer.

11. Adhesive film for electronic parts as recited in claim 10, wherein said at least one adhesive comprises a thermosetting resin.

12. Adhesive film for electronic parts as recited in claim 11, wherein said thermosetting resin comprises at least one of epoxy resin and phenol resin.

13. Adhesive film for electronic parts as recited in claim 10, wherein said adhesive layer comprises a thermosetting resin and at least one resin selected from the group consisting of polyimide resin, polyamide resin, acrylonitrile-butadiene rubber and polyester resin.

14. Adhesive film for electronic parts as recited in claim 10, wherein said resin layer has a coefficient of thermal expansion not more than $300° C.^{-1}$ at −30 to 125° C.

15. Adhesive film for electronic parts as recited in claim 10, wherein said adhesive film adheres one of an IC chip and a reinforcing metal board to a circuit board.

16. Adhesive film for electronic parts as recited in claim 10, wherein said adhesive film adheres an IC chip to an IC chip.

* * * * *